United States Patent
Lin et al.

(10) Patent No.: US 9,373,934 B2
(45) Date of Patent: Jun. 21, 2016

(54) VERTICAL INTEGRATION OF A HYBRID OPTICAL SOURCE

(71) Applicant: Oracle International Corporation, Redwood City, CA (US)

(72) Inventors: Shiyun Lin, San Diego, CA (US); Stevan S. Djordjevic, San Diego, CA (US); John E. Cunningham, San Diego, CA (US); Xuezhe Zheng, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 179 days.

(21) Appl. No.: 14/165,132

(22) Filed: Jan. 27, 2014

(65) Prior Publication Data

US 2015/0280403 A1 Oct. 1, 2015

Related U.S. Application Data

(60) Provisional application No. 61/861,908, filed on Aug. 2, 2013.

(51) Int. Cl.
| | |
|---|---|
| H01S 5/10 | (2006.01) |
| H01S 5/20 | (2006.01) |
| H01S 5/026 | (2006.01) |
| H01S 5/14 | (2006.01) |
| H01S 5/022 | (2006.01) |
| H01S 3/105 | (2006.01) |
| H01S 5/40 | (2006.01) |

(52) U.S. Cl.
CPC .............. *H01S 5/141* (2013.01); *H01S 5/02252* (2013.01); *H01S 3/105* (2013.01); *H01S 5/026* (2013.01); *H01S 5/1014* (2013.01); *H01S 5/2018* (2013.01); *H01S 5/4062* (2013.01); *H01S 5/4087* (2013.01)

(58) Field of Classification Search
CPC ..... H01S 5/026; H01S 5/2018; H01S 5/4012; H01S 5/1014
See application file for complete search history.

(56) References Cited

U.S. PATENT DOCUMENTS 5,261,015 A * 11/1993 Glasheen .............. G02B 6/356
                                                    385/23
5,465,899 A    11/1995 Quick
(Continued)

OTHER PUBLICATIONS

Zheng, Xuezhe et al. "Ultra-efficient 10Gb/s hybrid integrated silicon photonic transmitter and receiver", Mar. 14, 2011/vol. 19, No. 6/Optics Express 5172.

(Continued)

*Primary Examiner* — Eric Bolda
(74) *Attorney, Agent, or Firm* — Park, Vaughan, Fleming & Dowler LLP

(57) ABSTRACT

A hybrid optical source includes a substrate with an optical amplifier (such as a III-V semiconductor optical amplifier). The substrate is coupled at an angle (such as an angle between 0 and 90°) to a silicon-on-insulator chip. In particular, the substrate may be optically coupled to the silicon-on-insulator chip by an optical coupler (such as a diffraction grating or a mirror) that efficiently couples (i.e., with low optical loss) an optical signal into a sub-micron silicon-on-insulator optical waveguide. Moreover, the silicon-on-insulator optical waveguide optically couples the light to a reflector to complete the hybrid optical source.

16 Claims, 9 Drawing Sheets

(56) References Cited

U.S. PATENT DOCUMENTS

| | | | |
|---|---|---|---|
| 5,997,317 A | 12/1999 | Pei | |
| 6,091,755 A * | 7/2000 | Sanders | H01S 5/10 372/102 |
| 6,961,498 B2 * | 11/2005 | Luz | G02B 6/4226 385/147 |
| 8,442,368 B1 * | 5/2013 | Reano | G02B 6/132 385/29 |
| 2002/0191916 A1 * | 12/2002 | Frish | G02B 6/1228 385/43 |
| 2003/0228111 A1 * | 12/2003 | Luz | G02B 6/4226 385/52 |
| 2005/0030540 A1 * | 2/2005 | Thornton | A61B 5/14532 356/432 |
| 2007/0133990 A1 * | 6/2007 | Kim | B82Y 20/00 398/72 |
| 2012/0008650 A1 * | 1/2012 | Poustie | H01S 5/141 372/20 |
| 2012/0014398 A1 * | 1/2012 | Choi | G02B 6/421 372/20 |

OTHER PUBLICATIONS

Krishnamoorthy, Ashok V., et al. "Optical Proximity Communication With Passively Aligned Silicon Photonic Chips", IEEE Journal of Quantum Electronics, vol. 45, No. 4, Apr. 2009, pp. 409-414.

Harman, George G. et al. "The Ultrasonic Welding Mechanism as Applied to Aluminum- and Gold-Wire Bonding in Microelectronics", IEEE Transactions on Parts, Hybrids, and Packaging, vol. PHP-13, No. 4, Dec. 1977.

Zheng, Xuezhe et al. "Efficient WDM Laser Source towards TeraByte/s Silicon Photonic Interconnects", http://www.opticsinfobase.org/jlt/abstract.cfm?uri=jlt-31-24-4142, downloaded Jan. 28, 2014, pp. 1 thru 12.

Zheng, Xuezhe et al., "Ultra-low-energy all-CMOS modulator integrated with driver", Feb. 1, 2010/vol. 18, No. 3/Optics Express 3059.

Zilkie, A. J. et al. "Power-efficient III-V/Silicon external cavity DBR lasers", Oct. 8, 2012/vol. 20, No. 21/Optics Express 23456.

Fujioka, Nubuhide, "Compact and Lower Power Consumption Hybrid Integrated Wavelength Tunable Laser Module Using Silicon Waveguide Resonators", Journal of Lightwave Technology, vol. 28, No. 21, Nov. 2010, pp. 3115 to 3120.

Stankovic, S. et al. "1310 nm Evanescent Hybrid III-V/Si Laser Based on DVS-BCB Bonding", Photonics Research Group, Ghent University, Intel Corporation, OSA/ANIC/IPR/Sensors/SL/SOF/SPPCom/2011.

Yao, Jin et al. "Grating-coupler based low-loss optical interlayer coupling", Oracle Labs, San Diego, CA, 978-14244-8340-2/2011 IEEE, pp. 383 to 385.

Park, Hyundai, "Hybrid silicon evanescent laser fabricated with a silicon waveguide and III-V offset quantum wells", Nov. 14, 2005/vol. 13, No. 23/Optics Express 9460.

* cited by examiner

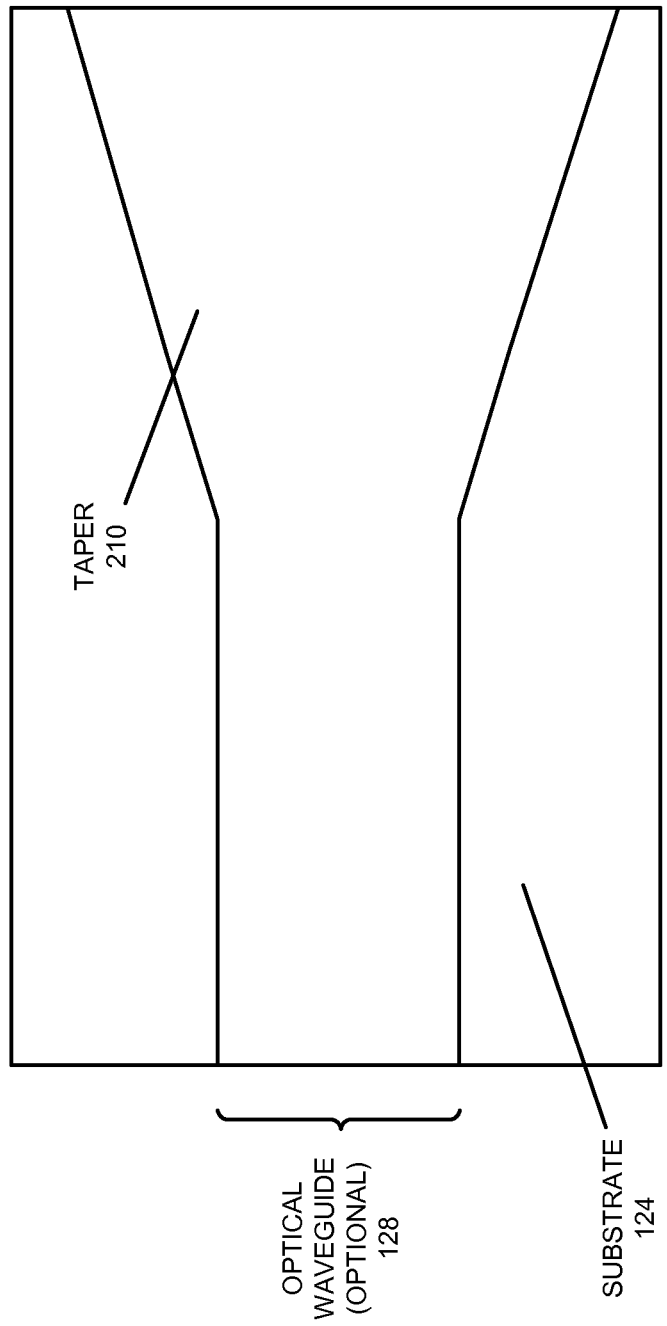

VERTICAL INTEGRATION OF A HYBRID OPTICAL SOURCE

CROSS-REFERENCE TO RELATED APPLICATION

This application claims priority under 35 U.S.C. §119(e) to U.S. Provisional Application Ser. No. 61/861,908, entitled "Non-Invasive Vertical Integration of Gain Materials with SOI Chips for Superior Scalability and High Efficiency Lasers," by Shiyun Lin, Stevan Djordjevic, John E. Cunningham, Xuezhe Zheng, and Ashok V. Krishnamoorthy, filed on Aug. 2, 2013, the contents of which are herein incorporated by reference.

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure generally relates to the design of a hybrid optical source. More specifically, the present disclosure relates to the design of a hybrid optical source with a semiconductor optical amplifier coupled at an angle relative to a silicon-on-insulator substrate.

2. Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low power (for example, less than 1 pJ/bit) optical interconnect, a high-efficiency optical source, such as a semiconductor laser or a laser source, is typically required. In particular, the required power consumption of the laser source may need to be 0.4 pJ/bit, and the required optical-waveguide-coupled wall-plug efficiency (defined as the laser power coupled into a silicon optical waveguide divided by the total consumed electrical power) of such a laser source usually needs to be greater than 10%. (While the energy cost of the laser source can, in principle, be better amortized at higher data rates, in practice receiver sensitivity decreases at higher data rates because there is less received photon energy per bit and the power consumption of receiver circuits using a given CMOS technology typically grows super-linearly with the data rate.)

However, most state-of-the-art laser sources have a wall-plug efficiency of only 1-2%. In these laser sources, a large amount (in excess of 80%) of the electrical power is usually consumed by thermal-electric cooling (TEC) to maintain high-power (greater than 10 mW) lasing with stable wavelength and good slope efficiency. While uncooled laser sources with sufficient wall-plug efficiency (around 10%) and output power (for example, 2-4 mW) are available for use in optical interconnects, the wavelength stability of these laser sources is often larger than 100 pm (because of the lack of temperature control), which is unsuitable for dense wavelength-division-multiplexing links. In addition, these laser sources are usually based on III-V semiconductors (such as indium phosphide, etc.). The large optical coupling loss between an optical waveguide in the III-V semiconductor laser source and a silicon optical waveguide could reduce the efficiency by 3-10 times.

Hence, what is needed is an optical source without the problems described above.

SUMMARY

One embodiment of the present disclosure provides a hybrid optical source that includes a substrate. This substrate includes: an optical waveguide, having an end and a second end, which conveys an optical signal; a reflector, optically coupled to the end of the optical waveguide, which partially reflects a wavelength in the optical signal; and an optical coupler, optically coupled to the second end of the optical waveguide, which redirects the optical signal into and out of a plane of a surface of the substrate. Moreover, the hybrid optical source includes a second substrate disposed at an angle relative to the plane and optically coupled to the optical coupler. The second substrate includes: a semiconductor optical amplifier, optically coupled to the optical coupler, where the semiconductor optical amplifier is defined in a semiconductor other than silicon and has an edge and a second edge, and where the semiconductor optical amplifier provides the optical signal at the edge; and a reflective coating, disposed on the second edge of the semiconductor optical amplifier, which reflects the optical signal.

In some embodiments, the second substrate includes a second optical waveguide, having a third end and a fourth end, which receives and provides the optical signal from the optical coupler at the third end, and which conveys the optical signal.

In some embodiments, the wavelength reflected by the reflector is tunable.

Moreover, the optical coupler may include a grating coupler and/or a mirror.

Furthermore, the second substrate may include a tilting device proximate to the edge of the semiconductor optical amplifier, where the tilting device changes a direction of propagation of the optical signal. Note that change in the direction of propagation by the tilting device may be adjustable.

Additionally, the reflector may include a ring-resonator reflector and/or a distributed Bragg reflector.

In some embodiments, the second substrate includes a regular taper or an inverse taper to change a mode size of the optical signal and/or the substrate includes a taper in conjunction with the optical coupler that is configured to approximately match a mode size before the optical coupler to the mode size of the optical signal.

Moreover, the substrate may be electrically coupled to the second substrate.

Note that the optical waveguide and the semiconductor optical amplifier between the reflector and the reflective coating may define an optical cavity.

In some embodiments, the hybrid optical source includes multiple instances of the optical waveguide, the reflector and the optical coupler, and multiple corresponding instances of the second substrate forming an array of hybrid optical sources.

Furthermore, the substrate may include: a buried-oxide layer disposed on the substrate; and a semiconductor layer disposed on the buried-oxide layer, where the optical waveguide, the reflector and the optical coupler are defined in the semiconductor layer. For example, the substrate, the buried-oxide layer and the semiconductor layer may constitute a silicon-on-insulator technology.

Another embodiment provides a system that includes: a processor, memory, and the hybrid optical source.

Another embodiment provides a method for providing the optical signal having the wavelength. During the method, the optical signal is generated using the semiconductor optical amplifier disposed on the second substrate at the angle relative to the plane of the surface of the substrate. Then, the optical signal is optically coupled to the substrate. Furthermore, the optical signal is conveyed in the optical waveguide disposed on the substrate. Next, a portion of the optical signal is reflected using the reflector that is optically coupled to an end of the optical waveguide, and a remainder of the optical signal is provided using the reflector.

BRIEF DESCRIPTION OF THE FIGURES

FIG. 2 is a block diagram illustrating a top view of a substrate in the hybrid optical source of FIG. 1A in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1A:
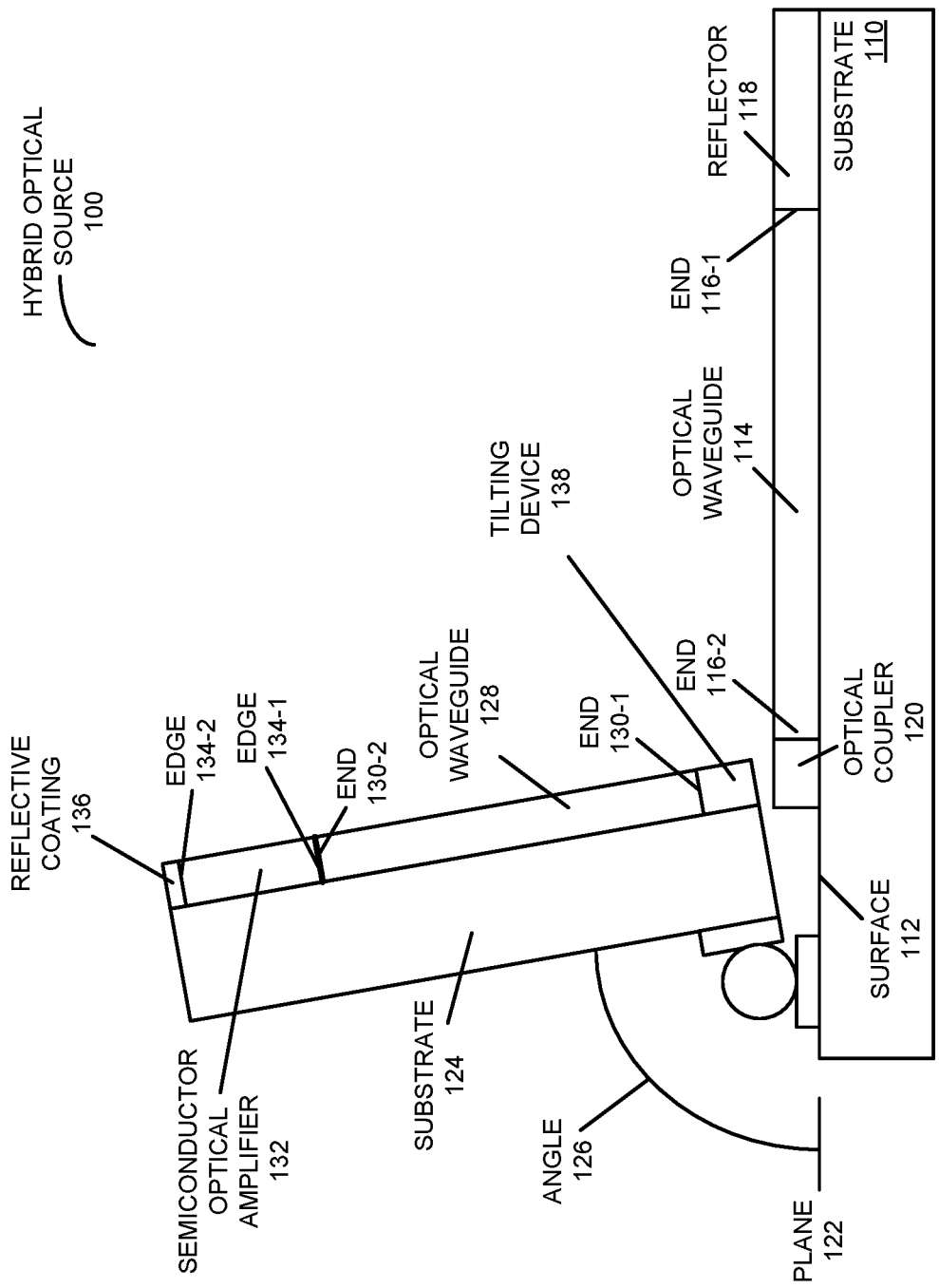
FIGS. 1A-1D illustrates a side view for different configurations of a hybrid optical source in accordance with an embodiment of the present disclosure.

Embodiments of a hybrid optical source, a system that includes the hybrid optical source, and a method for providing an optical signal having a wavelength are described. This hybrid optical source includes a substrate with an optical amplifier (such as a III-V semiconductor optical amplifier). The substrate is coupled at an angle (such as an angle between 0 and 90°) to a silicon-on-insulator chip. In particular, the substrate may be optically coupled to the silicon-on-insulator (SOI) chip by an optical coupler (such as a diffraction grating or a mirror) that efficiently couples (i.e., with low optical loss) the optical signal into a sub-micron silicon-on-insulator optical waveguide. Moreover, the silicon-on-insulator optical waveguide optically couples the light to a reflector to complete the hybrid optical source.

In this way, the hybrid optical source can provide a laser source with high wall-plug efficiency, accurate wavelength control and high-tuning efficiency, thereby facilitating high-performance optical interconnects for use in applications such as high-performance computing. In addition, this integration technique may increase the yield and reduce the cost of the hybrid optical source.

We now describe embodiments of the hybrid optical source. A variety of approaches have been proposed to make an efficient laser source for use in silicon-photonic links. These approaches typically require hybrid integration, with low optical losses, of an efficient gain or active medium on an optical-amplifier chip (such as a III-V semiconductor optical-amplifier chip, which is sometimes referred to as a 'III-V optical-amplifier chip') with an optical waveguide on a SOI chip. However, the large lattice mismatch between silicon and III-V semiconductors typically makes direct epitaxial growth of III-V semiconductors on silicon difficult. In principle, wafer bonding and edge-coupling are alternatives for hybrid integration of III-V semiconductor chips with SOI chips. In practice, these approaches have their own limitations. For example, wafer bonding using either oxide-to-oxide fusion or benzocyclobutene bonding may be limited by the low carrier-injection efficiency and thermal impedance mismatch, while edge-to-edge butt-coupling often has limited scalability because it is implemented along one dimension.

In the discussion that follows, hybrid integration is achieved by vertically coupling a III-V semiconductor chip with a SOI chip containing selective reflectors (which may be tunable). The edge facet of the III-V semiconductor chip may be directly aligned with a silicon optical-waveguide grating coupler on the SOI chip. The vertical-to-horizontal interface between the III-V semiconductor chip and the SOI chip may facilitate electrical and optical signaling between the III-V semiconductor chip and the SOI chip. Moreover, this non-invasive, surface-normal integration technique may provide superior scalability, thereby facilitating a high-density 2-dimensional (2D) laser array directly on silicon. The resulting hybrid optical source may provide a highly efficient tunable laser because of the ability to independently fabricate (and, thus, optimize) the III-V semiconductor chip and the SOI chip.

FIG. 1 presents a block diagram illustrating a side view of a hybrid optical source 100 that includes a substrate 110 having a surface 112. This substrate includes: an optical waveguide 114, having ends 116, which conveys an optical signal; a reflector 118, optically coupled to end 116-1 of optical waveguide 114, which partially reflects a wavelength in the optical signal (such as 95% of the optical signal); and an optical coupler 120, optically coupled to end 116-2 of optical waveguide 114, which redirects the optical signal into and out of a plane 122 of surface 112. Note that the wavelength reflected by reflector 118 is tunable. For example, reflector 118 may be thermally tuned. Moreover, reflector 118 may include a ring-resonator reflector and/or a distributed Bragg reflector. Furthermore, optical coupler 120 may include a diffraction grating or a grating coupler (with an optional backside mirror) and/or a mirror. For example, the mirror may be etched into substrate 110 (such as a mirror etched at 54.7° in silicon) or a cleaved facet with a high-reflectivity coating. This reflector may cover the entire range of wavelengths output by semiconductor optical amplifier 132.

Additionally, hybrid optical source 100 includes a substrate 124 disposed at an angle 126 relative to plane 122 (such as 11.30 from a normal to plane 122) and optically coupled to optical coupler 120. Note that angle 126 may reduce reflections from a facet or end 130-1 of optional optical waveguide 128, which is disposed on substrate 124, and optional optical waveguide 128 may be actively or passively aligned with optical coupler 120. Optional optical waveguide 128 receives and provides the optical signal at end 130-1 (without requiring the use of lossy optical components, such as grating couplers or mirrors, on substrate 124), and conveys the optical signal. In addition, substrate 124 includes: semiconductor optical amplifier 132, optically coupled to end 130-2 of optional optical waveguide 128, where semiconductor optical amplifier 132 is defined in a semiconductor other than silicon and has edges 134, and where semiconductor optical amplifier 132 provides at least the optical signal at edge 134-1; and a reflective coating 136, disposed on edge 134-2 of semiconductor optical amplifier 132, which reflects the optical signal. (Note that in embodiments without optional optical waveguide 128, shown in FIG. 1C-1D, the optical signal may be directly coupled from semiconductor optical amplifier 132 to optical coupler 120.) For example, semiconductor optical amplifier 132 may be a reflective semiconductor optical amplifier or a semiconductor laser with gain induced by current injection. In some embodiments, semiconductor optical amplifier 132 includes a III-V semiconductor. Thus, semiconductor optical amplifier 132 may include an active layer having a band gap wavelength that exceeds that of silicon.

Figure 1B:
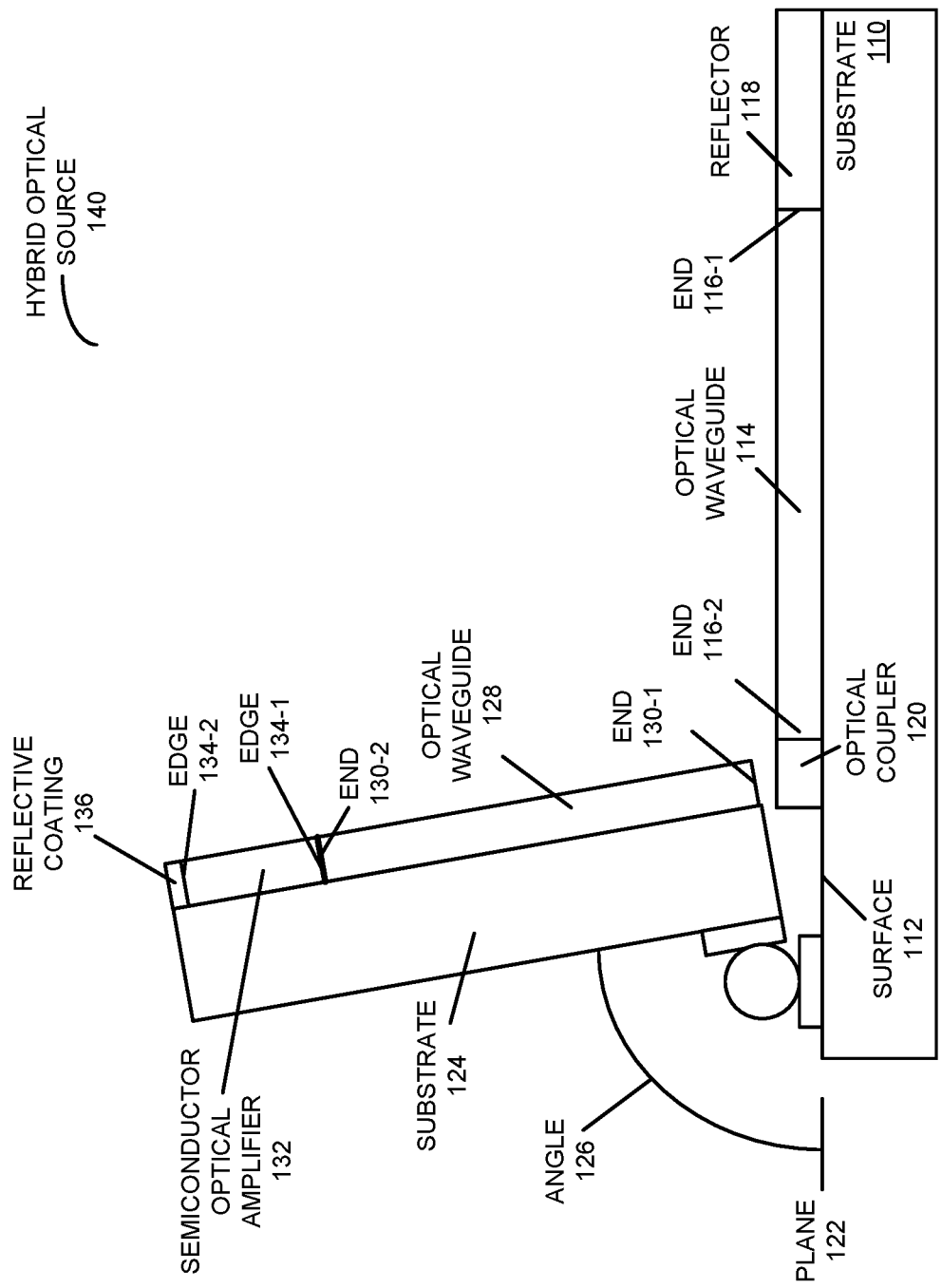
Figure 1C:
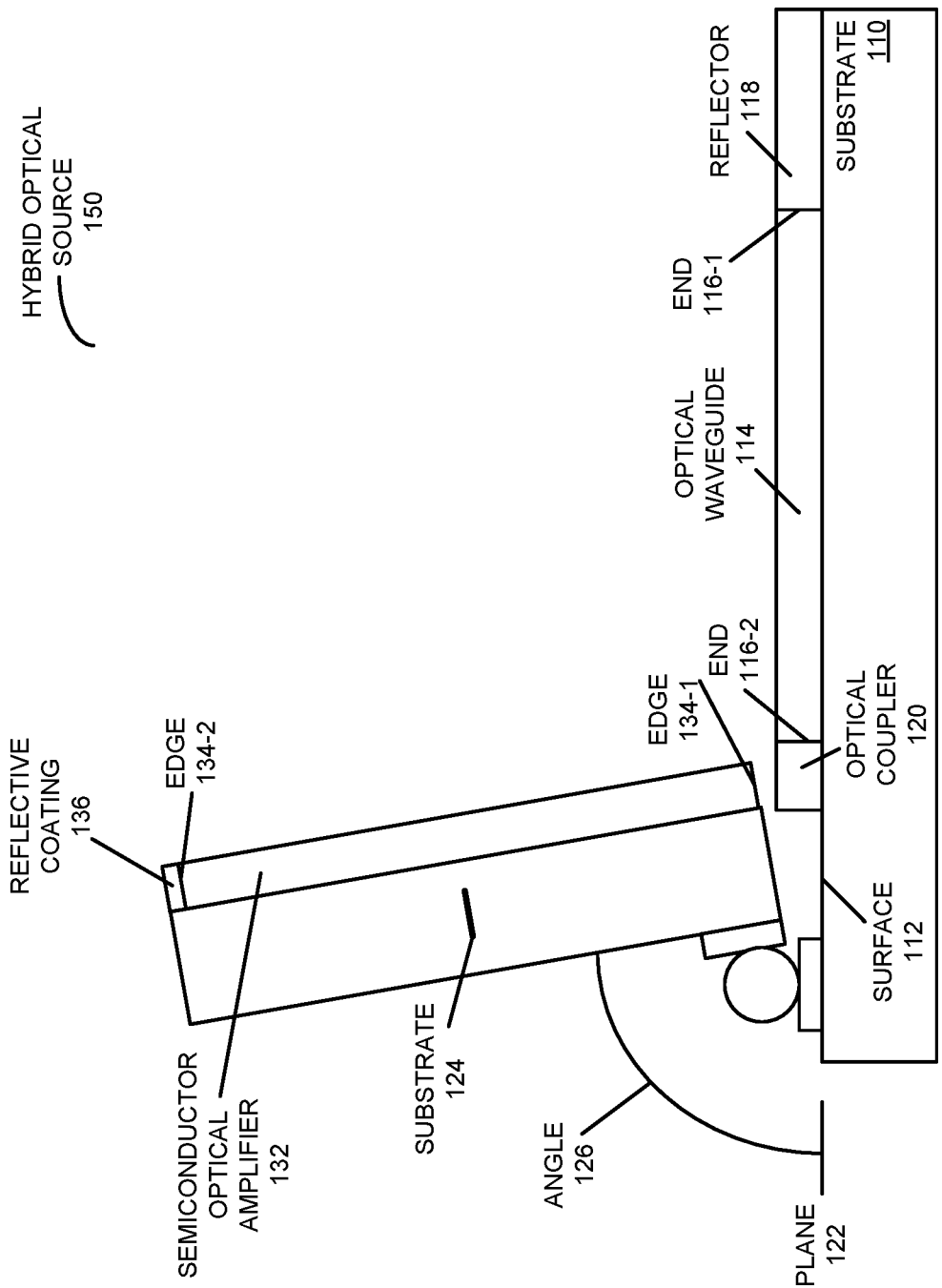
Figure 1D:
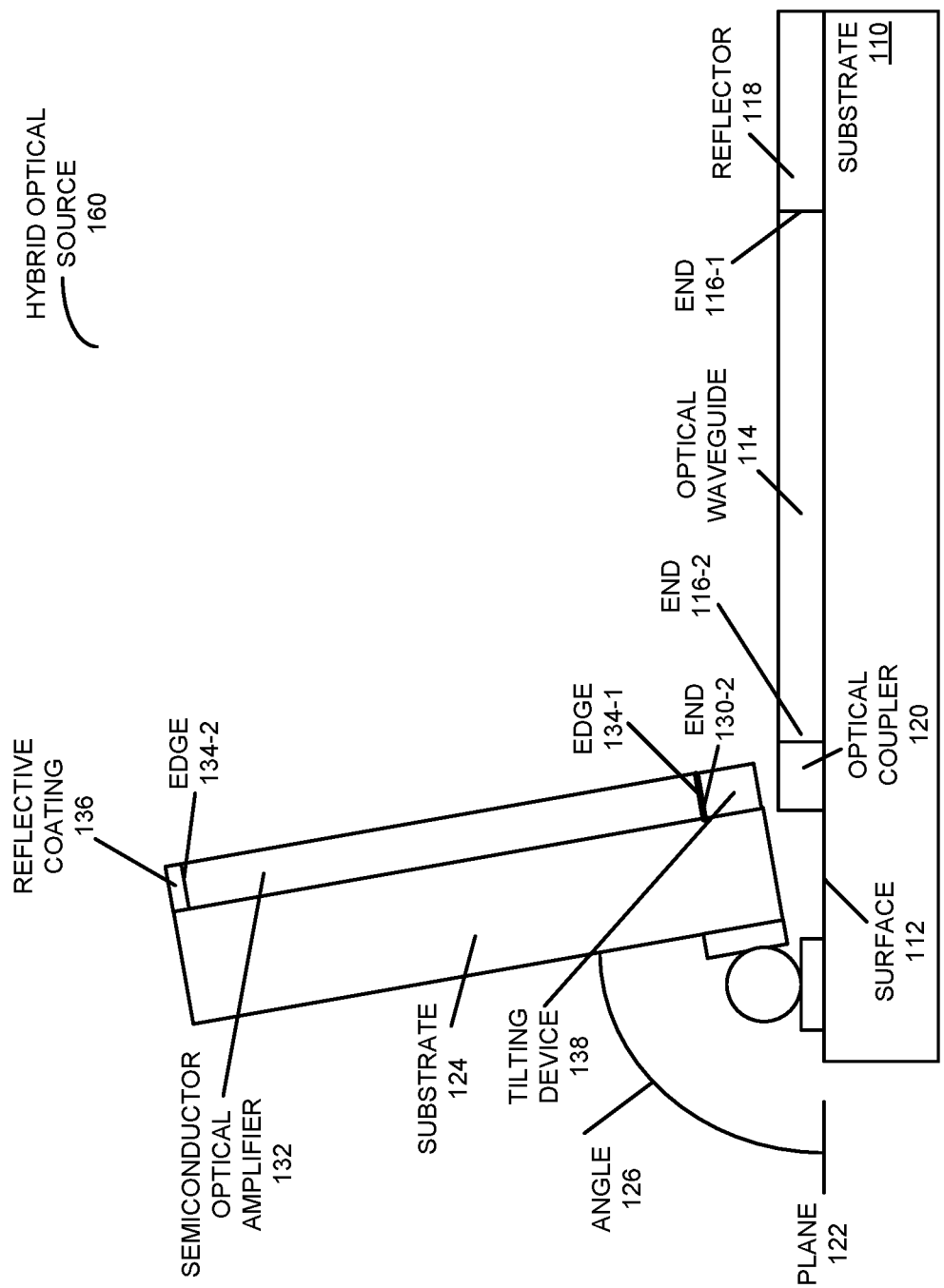

Note that substrate 124 may include an optional tilting device 138 proximate to end 130-1 of optional optical waveguide 128 (see FIG. 1A) or proximate to the edge 134-1 of the semiconductor optical amplifier (see FIG. 1D), where optional tilting device 138 changes a direction of propagation of the optical signal. The change in the direction of propagation by optional tilting device 138 may be adjustable. Figures FIG. 1B-1C show embodiments without the optional tilting device 138.

In some embodiments, substrate 110 is electrically coupled to substrate 124. For example, power and ground may be electrically coupled from substrate 110 to substrate 124. In particular, the electrical coupling may be facilitated using: a ball-grid array, wire bonds and/or flexible connectors (such as compression-compliant micro-spring connectors). Note that, because substrate 110 is horizontal, the electrical contacts may be on surface 112, which may reduce a cost of hybrid optical source 100.

Because optional optical waveguide 128 on a III-V semiconductor substrate 124 may have an optical mode with a diameter of 1-3 μm, while the diameter of the optical mode in optical waveguide 114 on a silicon substrate 110 may typically be less than 1 μm, tapers may be integrated on either or both of optical waveguides 114 and 128 to better match the sizes of their optical modes. This is shown in FIG. 2, which presents a block diagram illustrating a top view of substrate 124 in hybrid optical source 100 (FIG. 1). In particular, substrate 124 may include a taper 210 configured to expand a mode size of the optical signal. Similarly, in FIG. 1, substrate 110 may include an inverse taper (not shown) in conjunction with optical coupler 120 to reduce the mode size before optical coupler 120 to approximately match the mode size of the optical signal.

In hybrid optical source 100, the optical signal may be confined in optical waveguides 114 and 128. This optical signal propagates in free-space (or in an equivalently transparent optical material, such as underfill) during the optical coupling between substrate 110 and substrate 124. Such bidirectional coupling between semiconductor optical amplifier 132 and reflector 118 creates a hybrid optical cavity for an external optical-cavity tunable laser source using wavelength-selective optical feedback from circuits on substrate 110, in which semiconductor optical amplifier 132 provides optical gain while reflector 118 controls the lasing wavelength. Thus, the optical cavity includes: optical waveguide 114, optional optical waveguide 128 and semiconductor optical amplifier 132 between reflector 118 and reflective coating 136.

In some embodiments, a distance between ends 116-2 and 130-1 is less than a predefined length (such as a couple of microns) so that divergence of the optical signal is reduced during optical coupling between substrates 110 and 124. This distance may also ensure that the size or diameter of the optical mode from substrate 124 matches that coming from optical coupler 120.

In this way, hybrid optical source 100 may provide low-loss (high-efficiency, proximity) optical coupling between semiconductor optical amplifier 132 and substrate 110 (and, in particular, into optical waveguide 114). The resulting hybrid optical source may combine the gain of a III-V semiconductor with the efficient wavelength control of silicon photonics, and thus can provide: a high wall-plug efficiency, a narrow lasing linewidth, a small footprint, low cost and high-yield integration. Moreover, even though the optical modes in semiconductor optical amplifier 132 and the (silicon) optical waveguide 114 are very different, they can be matched in free space so that the optical coupling loss is less than 2 dB. Thus, hybrid optical source 100 may facilitate a low-power (<1 pJ/bit) silicon-photonic interconnect or link.

In some embodiments, semiconductor optical amplifier 132 is uncooled and the wavelength is controlled by reflector 118. By backside etching substrate 110 to create one or more etch pits, reflector 118 may have improved thermal sensitivity so as to make the thermal tuning of hybrid optical source 100 ultra-efficient (i.e., very low power). In addition to reflector 118, substrate 110 may provide circuits, devices or components for fixing, tuning, monitoring, and controlling the wavelength of hybrid optical source 100, as well as cooling, to achieve the requisite tuning range, lasing linewidth and feedback control. For example, as described further below with reference to FIG. 5, semiconductor layer 514 may include an optional phase-tuning mechanism (which may be based on a thermal tuning or carrier-based index modulation) that adjusts the phase of the optical signal. This phase tuning may ensure that the proper optical-cavity length can be created to ensure coherent resonant feedback at the wavelength.

Figure 3:
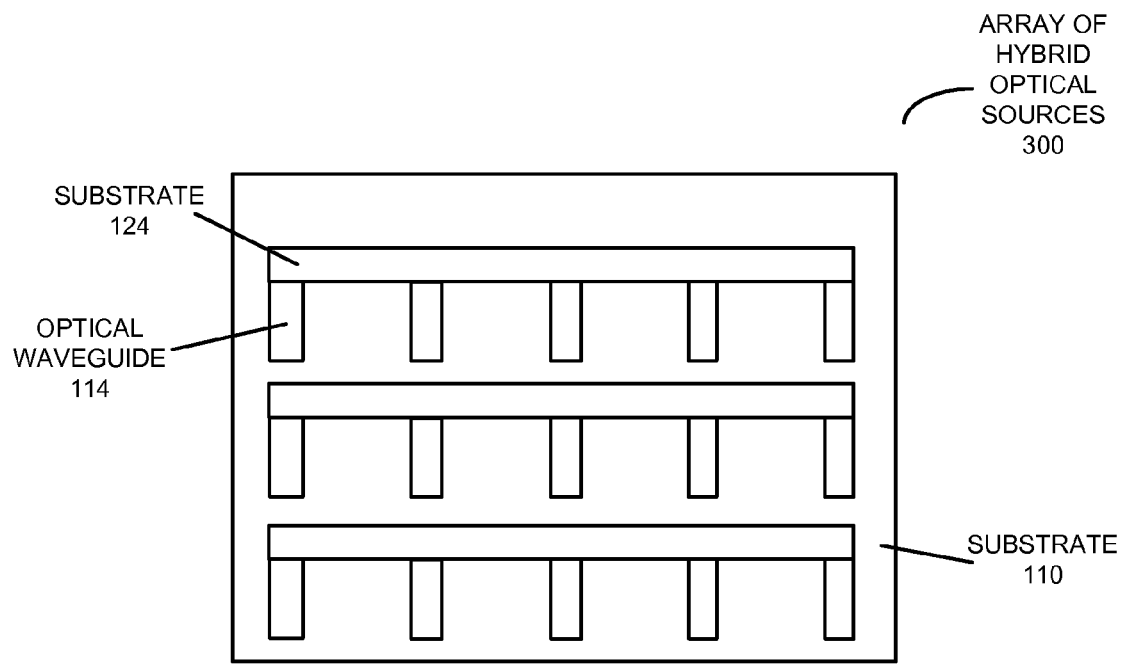
FIG. 3 is a block diagram illustrating a top view of an array of hybrid optical sources in accordance with an embodiment of the present disclosure.

As shown in FIG. 3, which presents a block diagram illustrating a side view of an array of hybrid optical sources 300, the hybrid optical source may be extended to provide a multi-wavelength tunable array of light-sources that can be concurrently created by attaching multiple instances of substrate 124 to substrate 110 (which may contain multiple instances of the optical couplers and the associated photonic components needed to create practical, efficient wavelength-division-multiplexing laser sources).

In FIG. 3, instead of or in addition to multiple instances of substrate 124, a multilayer gain block with optical-waveguide devices embedded along each instance of substrate 124 may be used to reduce the complexity of the array of hybrid optical sources. Metal contacts may be incorporated for each optical-waveguide device to form electrical input/output connections with substrate 110. Note that the multilayer gain block may be epitaxially grown and patterned layer-by-layer. In addition to facilitating simpler packaging, a higher density laser array may be obtained because of the reduced amount of real estate on surface 112 needed for each laser, which may be constrained by the size of electrical contacts and optical components on substrate 110.

Figure 4:
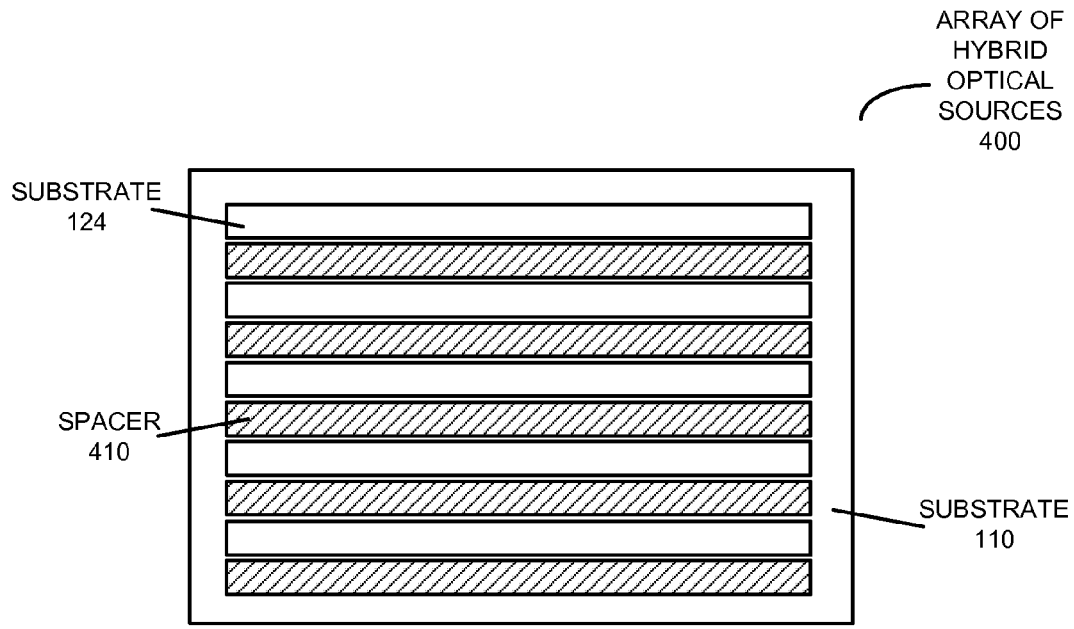
FIG. 4 is a block diagram illustrating a top view of an array of hybrid optical sources in accordance with an embodiment of the present disclosure.

As shown in FIG. 4, which presents a block diagram illustrating a side view of an array of hybrid optical sources 400, a chip stack having a staircase geometry (such as a ramp-stack chip package) may be used to provide one-operation integration of a high-density array of hybrid optical sources. This array of hybrid optical sources can be assembled accurately using 'pick and place' tooling. In addition, spacers (such as spacer 410) in the chip stack may be oxygen-free, high-thermal-conductivity copper sheets to effectively cool the laser bars.

Figure 5:
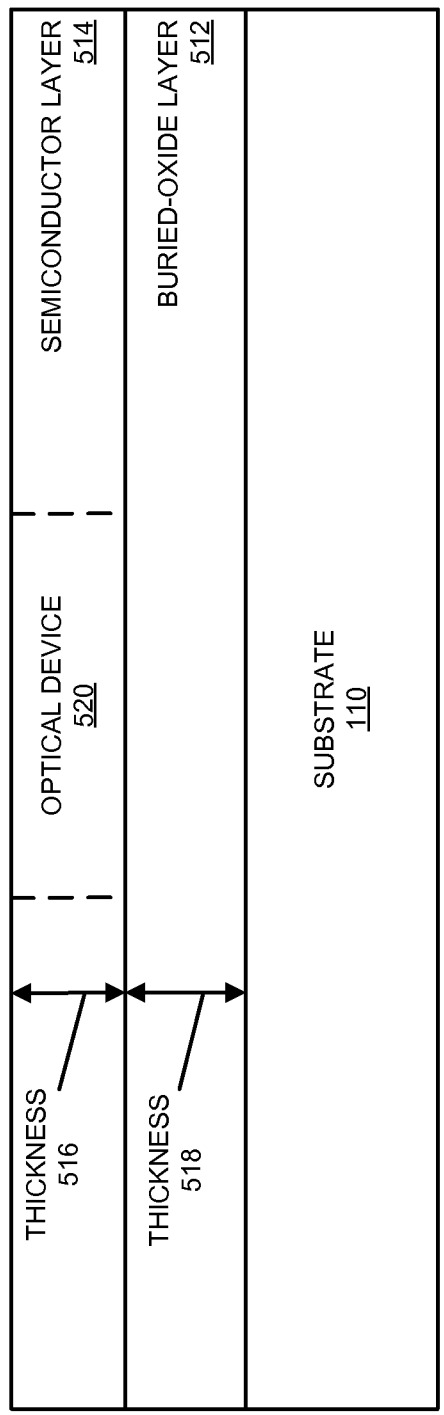
FIG. 5 is a block diagram illustrating a side view of a substrate in the hybrid optical source of FIG. 1A in accordance with an embodiment of the present disclosure.

As discussed previously, in an exemplary embodiment substrate 110 is a silicon substrate. Moreover, as shown in FIG. 5, which presents a block diagram illustrating a side view of substrate 110, a buried-oxide layer 512 may be disposed on substrate 110; and a semiconductor layer 514 may be disposed on buried-oxide layer 512, where optical waveguide 114 (FIG. 1), reflector 118 (FIG. 1) and optical coupler 120 (FIG. 1) are defined in semiconductor layer 514 (as represented by optical device 520). Thus, substrate 110, buried-oxide layer 512 and semiconductor layer 514 may constitute a SOI technology.

In an exemplary embodiment, the range of wavelengths of the optical signal output by semiconductor optical amplifier 132 (FIG. 1A) is between 1.1-1.7 μm. For example, hybrid optical source 100 (FIG. 1A) may be a laser providing an optical signal having a fundamental wavelength of 1.3 or 1.55 μm. Moreover, semiconductor layer 514 may have a thickness 516 that is less than 1 μm (such as 0.2-0.3 μm). Furthermore, buried-oxide layer 512 may have a thickness 518 between 0.3 and 3 μm (such as 0.8 μm).

Moreover, in an exemplary embodiment the hybrid optical source has a total output power of 7.5 mW and wall-plug efficiency of 4.3% with a pumping current of 105 mA. The threshold current may be 42 mA. Moreover, the linewidth of the lasing peak may be 0.8 pm with a side-mode suppression ratio of 35 dB. This hybrid optical source may provide single-mode lasing and a high thermal-tuning efficiency of 2.3 nm/mW. For example, the tuning range may be from 1557 nm to 1575 nm with a tuning power of 7.8 mW.

Figure 6:
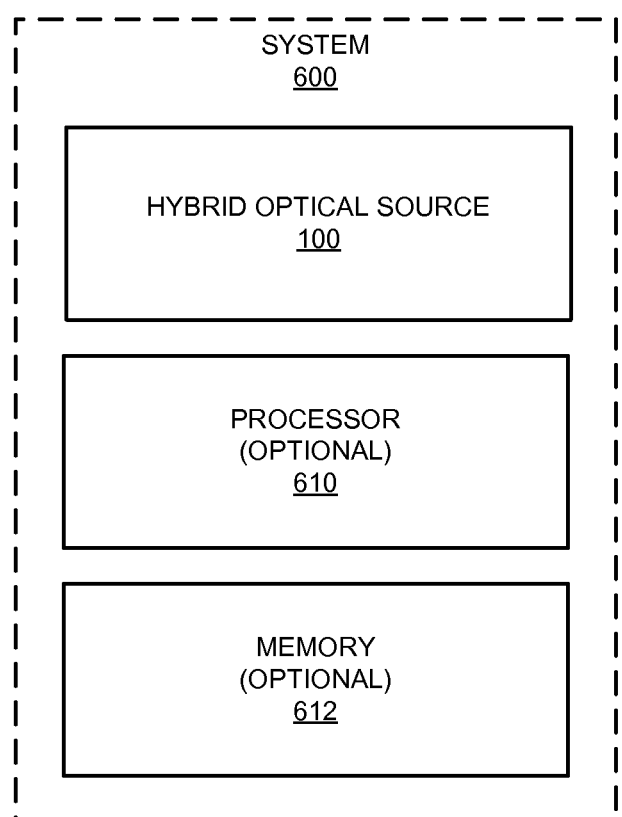
FIG. 6 is a block diagram illustrating a system that includes a hybrid optical source in accordance with an embodiment of the present disclosure.

We now describe the system. FIG. 6 presents a block diagram illustrating a system 600 that includes: hybrid optical source 100, an optional processor 610, and optional memory 612.

As noted previously, hybrid optical source 100 can be used as an external optical source to provide optical power to a silicon photonic chip, a silicon-photonic interconnect or link, or an optical fiber. More generally, hybrid optical source 100 can be used in a wide variety of applications, including communications, welding, medicine, etc. As a consequence, system 600 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a workstation, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the hybrid optical source and/or the system may include fewer components or additional components. For example, there may be a reflecting layer at the bottom of optical coupler 120 in FIG. 1A-1D to minimize the optical loss due to leaking through substrate 110. Such a reflecting layer can be a metal mirror deposited in a pit etched at the backside of optical coupler 120. In some embodiments, a top surface of semiconductor optical amplifier 132 in FIG. 1A-1D is passivated with either silicon dioxide or a polymer that has a very low index of refraction (such as 1.5). Additionally, the hybrid optical source may be reworked, so that defective components can be replaced, thereby increasing yield and reducing costs. Moreover, the substrates may include: a semiconductor die (such as silicon), a ceramic, an organic material and/or glass. Note that semiconductor optical amplifier 132 (FIG. 1A-1D) may use a semiconductor other than a III-V semiconductor.

Although the hybrid optical source and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. In addition, functionality in the preceding embodiments may be implemented more in hardware and less in software, or less in hardware and more in software, as is known in the art.

Note that components in the preceding embodiments of the hybrid optical source and the system may be fabricated using a wide variety of techniques, as is known to one of skill in the art.

Figure 7:
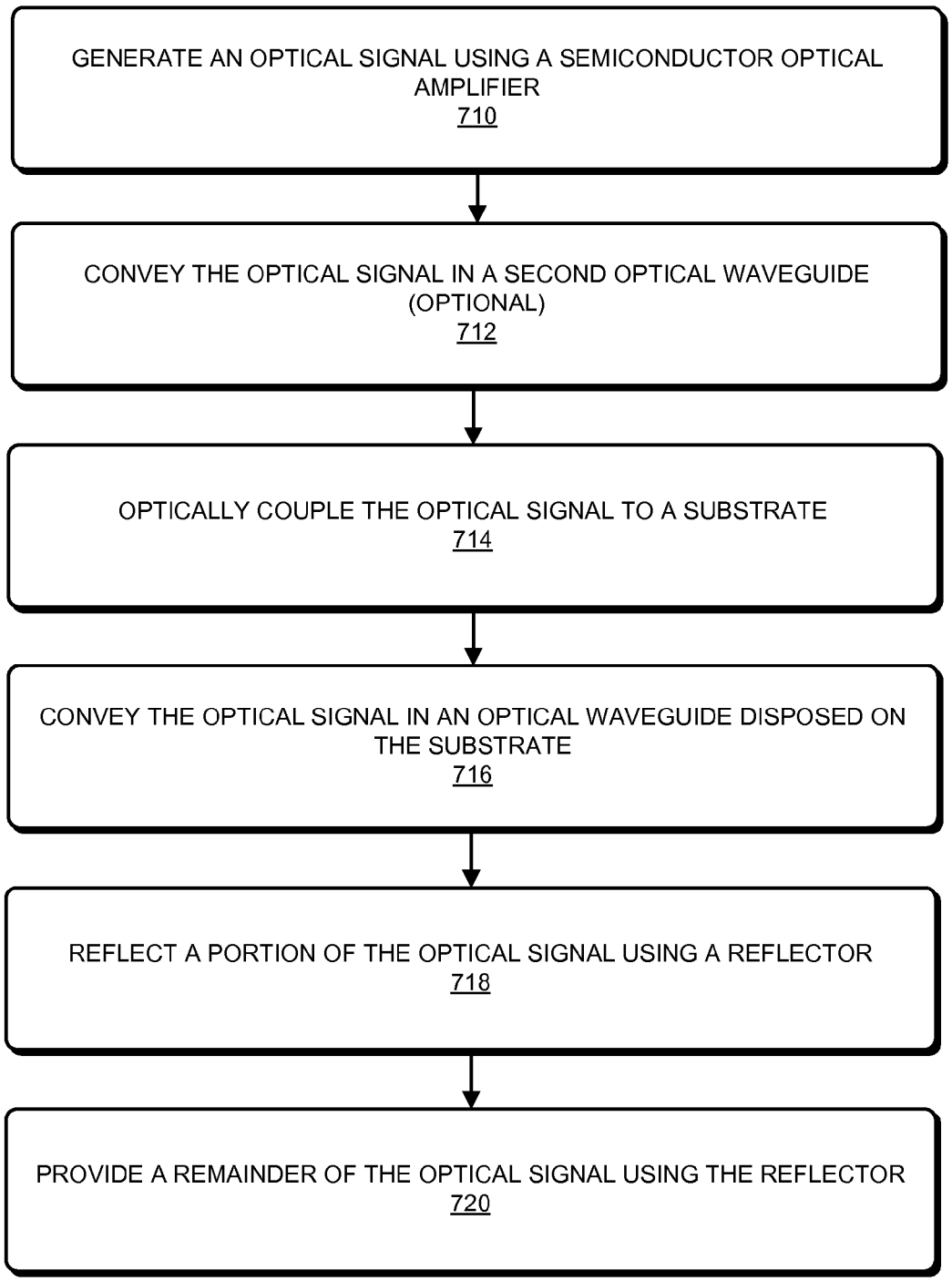
FIG. 7 is a flow diagram illustrating a method for providing an optical signal having a wavelength in accordance with an embodiment of the present disclosure.

We now describe the method. FIG. 7 presents a flow diagram illustrating a method 700 for providing an optical signal having a wavelength. During the method, an optical signal is generated using a semiconductor optical amplifier (operation 710) disposed on a second substrate at an angle relative to a plane of a surface of the substrate. Then, the optical signal is optionally conveyed in a second optical waveguide (operation 712) disposed on the second substrate and is optically coupled to a semiconductor optical amplifier. Moreover, the optical signal is optically coupled to a substrate (operation 714). Furthermore, the optical signal is conveyed in an optical waveguide disposed on the substrate (operation 716). Next, a portion of the optical signal is reflected using a reflector (operation 718) that is optically coupled to an end of the optical waveguide, and a remainder of the optical signal is provided using the reflector (operation 720).

In some embodiments of method 700, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:
1. A hybrid optical source, comprising:
a substrate having a surface, wherein the substrate includes:
an optical waveguide, having an end and a second end, configured to convey an optical signal;

a reflector, optically coupled to the end of the optical waveguide, configured to partially reflect a wavelength in the optical signal; and an optical coupler, optically coupled to the second end of the optical waveguide, configured to redirect the optical signal into and out of a plane of surface; and a second substrate disposed at an angle relative to the plane, wherein the second substrate is optically coupled to the optical coupler, and wherein the second substrate includes:

a semiconductor optical amplifier, optically coupled to the optical coupler, wherein the semiconductor optical amplifier is defined in a semiconductor other than silicon and has an edge and a second edge, and wherein the semiconductor optical amplifier is configured to provide the optical signal at the edge; and a second optical waveguide, having a third end and a fourth end, which receives and provides the optical signal at the third end, and which conveys the optical signal to the semiconductor optical amplifier; and a reflective coating, disposed on the second edge of the semiconductor optical amplifier, configured to reflect the optical signal.

2. The hybrid optical source of claim 1, wherein the wavelength reflected by the reflector is tunable.

3. The hybrid optical source of claim 1, wherein the optical coupler includes one of: a grating coupler; and a mirror.

4. The hybrid optical source of claim 1, wherein the reflector includes one of: a ring-resonator reflector; and a distributed Bragg reflector.

5. The hybrid optical source of claim 1, wherein the second substrate includes one of a regular taper and an inverse taper configured to change a mode size of the optical signal.

6. The hybrid optical source of claim 5, wherein the substrate includes a taper in conjunction with the optical coupler that is configured to approximately match a mode size after the optical coupler to the mode size of the optical signal.

7. The hybrid optical source of claim 1, wherein the substrate is electrically coupled to the second substrate.

8. The hybrid optical source of claim 1, wherein the optical waveguide and the semiconductor optical amplifier between the reflector and the reflective coating define an optical cavity.

9. The hybrid optical source of claim 1, wherein the hybrid optical source includes multiple instances of the optical waveguide, the reflector and the optical coupler, and multiple corresponding instances of the second substrate forming an array of hybrid optical sources.

10. The hybrid optical source of claim 1, wherein the substrate includes:

a buried-oxide layer disposed on the substrate; and a semiconductor layer disposed on the buried-oxide layer, wherein the optical waveguide, the reflector and the optical coupler are defined in the semiconductor layer.

11. A system, comprising:

a processor;

memory; and a hybrid optical source, wherein the hybrid optical source includes:

a substrate having a surface, wherein the substrate includes:

an optical waveguide, having an end and a second end, configured to convey an optical signal;

a reflector, optically coupled to the end of the optical waveguide, configured to partially reflect a wavelength in the optical signal; and an optical coupler, optically coupled to the second end of the optical waveguide, configured to redirect the optical signal into and out of a plane of surface; and a second substrate disposed at an angle relative to the plane, wherein the second substrate is optically coupled to the optical coupler, wherein the substrate is electrically coupled to the second substrate, and wherein the second substrate includes:

a semiconductor optical amplifier, optically coupled to the optical coupler, wherein the semiconductor optical amplifier is defined in a semiconductor other than silicon and has an edge and a second edge, and wherein the semiconductor optical amplifier is configured to provide the optical signal at the edge; and a reflective coating, disposed on the second edge of the semiconductor optical amplifier, configured to reflect the optical signal.

12. The system of claim 11, wherein the wavelength reflected by the reflector is tunable.

13. The system of claim 11, wherein the second substrate includes one of a regular taper and an inverse taper configured to change a mode size of the optical signal.

14. The system of claim 13, wherein the substrate includes a taper in conjunction with the optical coupler that is configured to approximately match a mode size after the optical coupler to the mode size of the optical signal.

15. The system of claim 11, wherein the hybrid optical source includes multiple instances of the optical waveguide, the reflector and the optical coupler, and multiple corresponding instances of the second substrate forming an array of hybrid optical sources.

16. A method of providing an optical signal having a wavelength, wherein the method comprises:

generating the optical signal using a semiconductor optical amplifier disposed on a substrate at an angle relative to a plane of a surface of a second substrate;

optically coupling the optical signal to the second substrate;

conveying the optical signal in a second optical waveguide disposed on the second substrate, wherein the substrate is electrically coupled to the second substrate;

reflecting a portion of the optical signal using a reflector that is optically coupled to an end of the second optical waveguide; and providing a remainder of the optical signal using the reflector.

* * * * *